United States Patent [19]

Ovshinsky et al.

[11] Patent Number: 5,324,553
[45] Date of Patent: Jun. 28, 1994

[54] METHOD FOR THE IMPROVED MICROWAVE DEPOSITION OF THIN FILMS

[75] Inventors: Stanford R. Ovshinsky, Bloomfield Hills; David V. Tsu, Rochester Hills; Rosa Young, Troy, all of Mich.

[73] Assignee: Energy Conversion Devices, Inc., Troy, Mich.

[21] Appl. No.: 89,207

[22] Filed: Jul. 9, 1993

Related U.S. Application Data

[63] Continuation-in-part of Ser. No. 56,156, Apr. 30, 1993.

[51] Int. Cl.$^5$ ............................................. B05D 3/06
[52] U.S. Cl. ................................. 427/571; 427/250; 427/255.3; 427/575; 427/576; 427/579; 427/598
[58] Field of Search ............... 427/488, 489, 490, 493, 427/509, 515, 568, 575, 578, 585, 571, 579, 250, 255.3, 598

Primary Examiner—Bernard Pianalto
Attorney, Agent, or Firm—Marvin S. Siskind

[57] ABSTRACT

An improved chemical vapor deposition method for the high-rate low-temperature deposition of high-quality thin film material. The method includes the steps of providing an evacuated chamber having a plasma deposition region defined therein; placing a substrate inside the chamber; supplying plasma deposition precursor gases to the deposition region in the evacuated chamber; directing microwave energy from a source thereof to the deposition region, the microwave energy interacting with the deposition precursor gases to form a plasma of electrons, ions and activated electrically neutral species, the plasma including one or more depositing species; increasing the surface mobility of the depositing species in the plasma by coupling additional non-microwave electronic energy and magnetic energy into the plasma, without intentionally adding thermal energy to the substrate or precursor gas; and depositing a thin film of material onto the substrate.

18 Claims, 3 Drawing Sheets

METHOD FOR THE IMPROVED MICROWAVE DEPOSITION OF THIN FILMS

RELATED APPLICATION INFORMATION

This Application is a continuation-in-part of co-pending U.S. application Ser. No. 08/056,156 filed Apr. 30, 1993.

FIELD OF THE INVENTION

This invention relates generally to apparatus and methods used for the high-rate, low-temperature deposition of high quality thin film materials. The invention more particularly relates to a novel method for high-rate, low-temperature deposition of alloys and fabrication of devices therefrom by microwave PECVD from reaction gases. The improved method includes exciting microwave initiated plasmas by a combination of very low frequency ion cyclotron resonance (LFICR) and conventional microwave electron cyclotron resonance (MWECR). The pressure regime in which the deposition occurs is in the millitorr range so as to provide an ultra-clean deposition environment to prevent the deposition of contaminants.

BACKGROUND OF THE INVENTION

While the discussions and detailed descriptions of the present invention set forth hereinbelow have been primarily directed toward the deposition of thin films of amorphous semiconductor material, it should be noted that the present technique can be used for the high-rate, low temperature deposition of many other materials. Particularly, the method can be used to deposit materials whose total microstructural local environment includes amorphous, nanocrystalline, microcrystalline, polycrystalline and monocrystalline as well as combinations thereof and intermediate metastable states. The materials which may be deposited by the method of the present invention are not limited to semiconductors, but can also include metals, ceramics, glasses, polymers, dielectrics, insulators and photoactive materials. Of particular interest are semiconductors, high density oxides and nitrides, conductive metals and ceramic protective coatings. Also of interest are nanocrystalline materials having grain features of 30 Angstroms or less.

Another example of a field of particular interest, other than semiconductor materials, is metallic aluminum and/or copper conductive pathway deposition for ultra large-scale integration (ULSI) of electrical circuits. Today, as integrated circuit technology strives for higher and higher integration densities, the width of the electrical current carrying pathway required to achieve these integration densities has become much smaller. In the present state of the technology, there is difficulty with the physical vapor deposition process by which such narrow conducting lines are formed by conventional sputtering techniques. Deposition of conductive pathway material into the openings in the photolithographic masking, which are sometimes as small as nanometers wide, causes a shadowing problem. That is, because PVD produces non-conformal coverage, which leads to thinning at the edges and walls of vias and trenches and to big holes in vias. Therefore, there is a limit to the narrowest effective width to which the conductive pathways can be deposited, without forming open circuits therein.

In general, CVD offers better coverage conformality than PVD. Given the chemical vapor deposition method of the present invention, the depositing species can have a much higher surface mobility, and can therefore "fill in" the shadowed areas, thereby effectively extending the lower limit on the narrowest effective width to which conductive pathways can be deposited.

Prior to turning to the use of the novel method disclosed herein for depositing high quality amorphous silicon alloy material, it is significant to elucidate the reader as to the full capabilities of this method to deposit new and phenomenally different quantum mechanical materials.

A considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

A reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

Amorphous semiconductor alloys made by the prior art processes have demonstrated photoresponsive characteristics ideally suited for photovoltaic applications. These prior art processes however suffered from relatively slow deposition rates and low utilization of the reaction gas feed stock which are important considerations from the standpoint of making photovoltaic devices from these materials on a commercial basis. To alleviate the problem of slow deposition rate, a microwave plasma deposition processes was invented by Ovshinsky, et al. See U.S. Pat. No. 4,517,223, Method of Making Amorphous Semiconductor Alloys and Devices Using Microwave Energy, which issued on May 14, 1985, the disclosure of which is hereby incorporated by reference. The microwave plasma process herein provides substantially increased deposition rates and reaction gas feed stock utilization. Further, the microwave process resulted in the formation of reactive species not previously obtainable in sufficiently large concentrations with other processes. As a result, new amorphous semiconductor alloys could be produced having substantially different material properties than previously obtainable.

The principal advantage that microwave (e.g., 2.45 GHz) generated plasmas have over the more widely used radio frequency (e.g., 13.56 MHz) generated plasmas is that the thin film deposition rates are generally higher by factors of 10 to 100. This enhanced rate comes about because of the increased fraction of all the electrons in the plasma which have the necessary energy to be chemically relevant, i.e., energies greater than about 3 to 4 eV in which to excite molecules, and especially energies greater than 8 to 12 eV in which to dissociate and/or to ionize molecules. In other words, for the same power densities, microwave plasmas are more effective in generating the chemically active species (i.e., excited molecules, dissociated, very reactive radicals, ions, etc.), which are necessary to form thin films, than are radio frequency plasmas. One obstacle that has prevented thin film microwave plasma deposition from being more widely used is that the thin film material properties (e.g., electronic, density, etc.) tend to be inferior to those deposited by radio frequency plasma.

More recently, dual-frequency plasma deposition has been investigated as a method for simultaneously combining the advantageous features of both microwave and radio frequency plasma depositions. That is, while microwave plasma is very efficient for generating active species in the gas phase (because of a relatively higher population of electrons in the energetic tail of the electron energy distribution function), resulting in deposition rates an order of magnitude higher than those observed at lower frequencies, the quality of the deposited material is lacking. On the other hand, radio frequency plasma is characterized by a negative d.c. bias at the cathode, which controls the flux and energy of ions impinging on the cathode surface, resulting in high quality thin film deposition, but at very low deposition rates. Dual-frequency plasma deposition using both microwave energy at 2.45 GHz and radio frequency energy at 13.56 MHz has been shown to produce better quality thin films than microwave energy alone at a higher deposition rate than radio frequency energy alone. See Klemberg-Sapieha et al, "DUAL MICROWAVE-R.F. PLASMA DEPOSITION OF FUNCTIONAL COATINGS", Thin Solid Films, vol. 193/194, December, 1990, pages 965-972.

Although this dual-frequency (DF) plasma deposition method clearly has advantages over single frequency microwave (MW) or radio frequency (RF) plasma, it clearly only a compromise. While DF plasma has higher deposition rates than RF plasma, the rates are unquestionably lower those of MW plasma. Also, while the quality of DF plasma deposited films is greater than those deposited by MW plasma, it is undoubtedly lower than those deposited by RF plasma. It has been found that at the higher deposition rates of MW plasma deposition, it becomes increasingly important that the active neutrals (i.e. chemically activated, electrically neutral species) have higher kinetic energy so that when they arrive at the film surface, they will have the necessary surface mobility to create a high quality film.

In the discussion of microwave plasma deposition above attention should be focused on the electrons, for it is the electrons, which excite, dissociate and ionize the gaseous molecules. One possible mechanism why microwave energy leads to higher electronic energy in the plasma is that the electrons can resonantly couple to the energy. For example, in typical microwave plasmas, the electron density can range from $10^{10}$ to $10^{11}$ per $cm^3$. At these densities, the resulting plasma oscillation frequency is on the same order as the applied radiation, namely in the low GHz range. Although a tremendous amount of the energy of the high frequency radiation can be pumped into the electrons by resonantly coupling, little if any of that energy can be transferred into kinetic energy of the ions and neutral molecules. This is because the ions are too massive to respond to the high frequency oscillations of the microwave and/or radio frequency energy, and also the energy gain of the electrons cannot be effectively transferred to the ions/neutrals due to the their large difference in mass.

There are two ways to resonantly couple energy into a plasma: (a) by high frequency radiation, which couples into the electrons; and (b) by low frequency radiation, which couples into the ions. When energy is pumped into the ions, their energy is very effectively transferred into the neutrals owing to their similarity in masses. Heating of the neutrals is desirable because it is the neutrals which overwhelmingly account for the deposition rate. It should be noted that because a relatively few ions must heat a large number of neutrals, efficiency requirements dictate the need to resonantly couple energy into the ions.

Large scale uniform deposition in rf plasma systems is not a serious issue because the wavelength at 13.56 MHz is more than 22 m, i.e., much greater than any practical deposition chamber. However, since the wavelength at the microwave frequency of 2.45 GHz is only 12.2 cm, the technical challenges in achieving uniform depositions over the desired scale of 30 cm are evident. Because of this, deposition results (e.g., film quality from a certain point in parameter space) obtained from small sized microwave research reactors (~5 cm substrates), cannot be automatically applied to the larger production systems because the hardware implementation will be fundamentally different. Scaling the process to larger sizes is not simply a matter of making larger electrodes (as it is in rf plasma systems) but involves new concepts. Although others have demonstrated high quality a-Si:H films with solar cell efficiencies approaching the best rf deposited material, similar results on the large production scale have yet to be demonstrated.

The record efficiency of 13.7% (active area, initial efficiency) for a multijunction a-Si alloy cell from PECVD was reported in 1988 by J. Yang et al. of ECD Proceedings of the 20th IEEE PV Specialists Conference (1988) page 241. Since then, progress has only been made in improving the large area module efficiency, which has now reached the initial efficiency of 10-11% and stable efficiency of 9-10%. The lack of progress in improving the quality of the narrow bandgap ($E_g < 1.5$ eV) a-SiGe alloy as well as the wider bandgap a-SiC alloys (eV > 1.8 eV) is the primary reason preventing further efficiency enhancement. In order to reach the DOE goal of a stable 15% efficiency for modules by the year 2005, a major breakthrough of materials on either narrow bandgap a-SiGe alloy material or wider bandgap a-SiC alloy materials has to be made. The glow discharge technique which has been very successful in fabricating high quality a-Si:H has not been able to provide equivalently high quality material where the base alloy has been modified to widen or narrow the bandgap. Simply stated, the photovoltaic properties of the alloys severely deteriorate with increasing Ge or C content.

Generally, the film quality of a-SiGe alloys, as characterized by the defect density measured from sub-bandgap absorption, the network disorder measured from the Urbach parameter and the photosensitivity ($\sigma_{light}\sigma_{dark}$), deteriorate with increasing Ge content. The deterioration of the material quality severely affect the fill factor (FF) of the devices. As the Ge content of the intrinsic layer of a PV device exceeds 40% (i.e., $E_g < 1.5$ eV), the FF becomes so poor that no decent device can be made. To maintain a good FF ($\sim 0.7$), the current multijunction solar cell can only use materials with $1.5 \text{ eV} \leq E_g \leq 1.75$ eV. Should the narrow bandgap $1.2 \text{ eV} < E_g < 1.5 \text{ eV}$ a-SiGe alloy be made of a quality which approaches that of an a-Si:H alloy, a multijunction laboratory device would have an efficiency of $\geq 17\%$ (i.e. Voc=2.5 V, FF=0.75 and Jsc>9 mA/cm$^2$) and a 15% stable module efficiency could be obtained.

In a conventional PECVD system, the gas phase environment contains electrons, various types of ions, chemically active neutral species (i.e. free radicals) and molecules. At an operating pressure of 0.5-1.0 Torr the degree of ionization is extremely low (i.e. $<10^{-6}$). Therefore, only the free radicals contribute to the film growth. Electrons, due to their light mass, gain energy from the electric field much more effectively than the heavier ions. The electron energy distribution can be roughly described as a Maxwell-Boltzmann distribution with average electron energies around 2 eV, corresponding to an electron temperature of $\sim 10^4$ K. Since the ions are able to receive some energy from the field, their temperature is slightly above ambient. The typical ion energy is around 0.04 eV or $\sim 500$ K. Because of the low degree of ionization, and the low ion energy, the neutral free radicals remain essentially at ambient temperature. In other words, the kinetic temperature of the film precursors from conventional PECVD processes is around 0.025 eV or 300 K.

In any deposition process, the surface mobility of the precursor species is a critical parameter in determining the quality of the depositing film. It is important that the precursor species, upon their arrival at the surface, be able to move around to find energetically favored sites and to fill microvoids. Since the film precursors from PECVD are not energetic, the precursor primarily rely on the substrate temperature ($T_s$) as the energy source. Unfortunately, the $T_s$ of hydrogenated amorphous films are limited by the hydrogen evolution temperature which is much lower than the crystallization temperature. For example, the crystallization temperature of silicon is $\sim 630°$ C., whereas hydrogen evolution from the a-Si:H film begins at a temperature of about 250°-275° C. Films deposited at $T_s$ above 275° C. from a conventional PECVD system will have a higher number of dangling bonds due to hydrogen evolution. In the case of a-SiGe:H film deposition, because the bond strength of Ge-H is weaker than Si-H, hydrogen evolution from Ge begins at 150° C. To prevent the preferential loss of hydrogen, one would expect that the film should be deposited at a $T_s$ of $\sim 150°$ C. However, experiments indicate that device performance of a-SiGe film deposited at $T_s$ of $\sim 150°$ C. is rather poor. Most of the so called "device quality" a-SiGe alloys with $E_g \geq 1.5$ eV are actually deposited at $\sim 300°$-325° C. As a result, the narrow bandgap films have a higher dangling bond density than the a-Si:H films.

Why do the a-SiGe alloys prefer to grow at higher temperatures, despite hydrogen evolution? One possibility is that Ge precursors in the plasma are less mobile than Si precursors because the Ge atom is bigger and heavier than the Si atom. In order for Ge to move as freely as Si on the growing surface, a higher $T_s$ is desirable. If not for H evolution, higher quality a-SiGe films might be grown at even higher temperatures. This argument also explains why the quality of the depositing film deteriorates with increasing Ge content, i.e., because at temperatures of 300°-325° C., the preferential loss of H from Ge sites is aggravated.

The lack of surface mobility in the depositing a-Ge:H film is also manifested by the high degree of disorder in the network and high porosity present in the deposited films. If the precursor species were mobile, they would have a greater opportunity of finding low energy sites so that not only a denser film could be made, but better, stronger bonds could be formed. Thus, increasing surface mobility of depositing species will lead to a reduction of weak bond formation and elimination of the Stablaer-Wronski effect. In the case of a-Si:H film growth, high quality material is typically deposited at a rate of 1-2 Å/sec at 250° C. The quality of the film deteriorates with increasing deposition rate. Since surface diffusion is a rate-limiting process, this result indicates that at 250° C., even the Si precursors can barely move fast enough to accommodate even low rate deposition. Should the surface mobility of Si precursors be further enhanced without increasing $T_s$, it would enable high quality a-Si:H alloy material to be deposited at much higher rates, even up to 100 Å/sec. High rate deposition translates into high production throughput and lower production costs.

From the above discussion, it becomes clear that one of the fundamental problems in the deposition of high quality a-SiGe films is fighting the conflicting growth parameters of surface mobility and hydrogen evolution.

Since fluorine bonds to Ge much more strongly than H, one would expect that the temperature fluorine evolution from Ge should be much higher than that of H from Ge. This is one reason to use a fluorine containing gas as precursor in the a-SiGe alloy deposition. However, a fluorine passivated surface is not as "slippery" as a H covered surface, because F is so reactive that it bonds too readily with film precursors at the first point of contact. Therefore, the a-SiGe:F film has more network disorder than an a-SiGe:H film. Nevertheless, it has been demonstrated that small amounts of F does help in making higher quality films.

Since there has not as yet been a way found to use F to replace H, and since the substrate temperature cannot be raised without H evolution, the only viable solution for depositing high quality a-SiGe film seems to be raising the kinetic temperature of the precursor species. As was pointed out previously, the kinetic temperature of the precursor species in PECVD is virtually ambient and the species will be heated at most to the substrate temperature. Clearly this temperature is not high enough.

Described hereinbelow are several unique features of PECVD which are important to a-Si and a-SiGe growth. First, there is an abundance of atomic hydrogen in the plasma. The atomic hydrogen on the growing surface can remove weak bonds and passivate dangling bonds. Hydrogen is needed in the structure not only to passivate dangling bonds, but to release strain in the tetrahedrally bonded amorphous network. Secondly, the dominant film precursor for a-Si:H deposition from PECVD is generally believed to be $SiH_3$. This is due to the low reactivity of $SiH_3$ with the primary discharge gases such as $H_2$ and $SiH_4$, which allows it to diffuse to the substrate surface. The advantage of such a low reactivity precursor is that it will have a small probability of surface reaction at the initial point of contact, and thus requires less energy to move around on that surface. This may be one of the reasons that PECVD a-Si:H exhibits the best photovoltaic properties compared to films deposited by other techniques. By analogy to silane chemistry, it is expected that $GeH_3$ is the dominant precursor for a-Ge:H film. However, $GeH_3$ is much heavier and diffuses slower than $SiH_3$. Hence, an a-Ge:H film is much more porous and of poorer quality than an a-Si:H film under the same deposition conditions. Finally, even though free radicals such as SiH, $SiH_2$, $SiH_3$, etc. are unable to gain kinetic energy, through elastic collisions with electrons, they can acquire quite high internal energy, in the form of vibrational and rotational energy, through various inelastic collision processes. For example, the vibrational and rotational temperatures of the free radical SiH have been measured from the intensity of the optical emission spectrum. In the electronically excited state, the temperatures are 4000 K. and 1800 K., respectively. In the ground state, they are 2000 K. and 485 K., respectively. The high internal energy of free radicals is another special feature of PECVD. It had been speculated that because of the high internal energy of free radicals, microcrystalline films can be grown at temperatures below 200° C.

In a-Si:H and/or a-SiGe:H film growth, the precursor species such as $GeH_3$ and/or $SiH_3$ arrive at the surface, move around, and locate the most energetically favorable low energy sites, thus forming a thin film on the substrate. Hydrogen elimination and a restructuring of the surface bonds will proceed to complete the growth process. However, energy is required for these processes to occur. The high internal energy of the precursor species may be an important energy source for the successful initiation of these processes. Therefore, techniques which solely heat the gas to increase the translational temperature of the precursor species cannot ensure the fabrication of high quality film. A number of aspects which are critically important to film growth in PECVD can be identified. For example, the abundance of atomic hydrogen, the low reactivity of precursor species and the high internal energy of those species are all important attributes in the growth of a-Si:H and a-SiGe:H films and should be present in the any advanced PECVD technology. A drawback with conventional embodiments of PECVD is the low kinetic temperature of the precursor species which have prevented the growth of high quality a-SiGe alloy films.

Therefore, there is still a strong felt need in the art for a safe method for the high-rate, low-temperature deposition of high-quality materials on large area substrates.

SUMMARY OF THE INVENTION

One aspect of the present invention is a microwave enhanced chemical vapor deposition method for high-rate, low-temperature deposition of thin film material. The method includes the steps of providing an evacuated chamber having a plasma deposition region defined therein; placing a substrate inside the chamber; supplying plasma deposition precursor gases to the deposition region in the evacuated chamber; directing microwave energy from a source thereof to the deposition region, the microwave energy interacting with the deposition precursor gases to form a plasma of electrons, ions and activated electrically neutral species, the plasma including one or more depositing species; increasing the surface mobility of the depositing species in the plasma by coupling additional non-microwave electronic energy and magnetic energy into the plasma, without intentionally adding thermal energy to the substrate or precursor gas; and depositing a thin film of material onto the substrate.

It is additionally useful to control the ratio of species, relative to one another in the plasma, particularly the ratio of ions to active neutrals, to prevent ion damage of the depositing thin film while also achieving the increase in surface mobility of the depositing species. Preferably, the magnetic energy is a magnetic field which is coupled to the microwave energy so as to provide electron cyclotron resonance, and the magnetic field should be 875 Gauss within the plasma when coupled to microwaves having a frequency of about 2.45 GHz. Also, the non-microwave electronic energy is preferably a low frequency alternating electrical field having a frequency of less than about 1 MHz, the frequency of the low frequency alternating electrical field creating an ion cyclotron resonance condition for one or more groups of ions in the plasma, under the influence of the magnetic field. While the precursor gases need only include those materials desired in the deposited thin films, they will typically include one or more of $GeH_4$, $GeF_4$, $SiH_4$, $SiF_4$, $F_2$, and $H_2$, and also may include inert, non-depositing gases such as argon or helium, when depositing silicon, germanium or silicon-germanium alloy materials. Useful frequencies for the low frequency alternating electrical field are about 18.5 kHz to induce ion cyclotron resonance for the Ge group of ions and about 48 kHz to induce ion cyclotron resonance for the Si group of ions. The microwave energy may be supplied at a power of between about 2 and about 5 kiloWatts and the low frequency alternating electrical field may be supplied at a power of between 0.1 and 1.0 kiloWatts.

The magnetic energy may be supplied by either permanent magnets or electromagnets placed in close proximity to the deposition region and the non-microwave electrical energy is supplied by antenna electrodes also placed in close proximity to the deposition region. Typical materials which can be deposited by the present method are metals, ceramics, polymers, glasses, semiconductors, photoconductors, dielectrics, oxides and nitrides, or any other material which is known to be depositable by conventional PECVD. Particularly, the method can be used to deposit materials whose total microstructural local environment includes amorphous, nanocrystalline, microcrystalline, polycrystalline and monocrystalline as well as combinations thereof and intermediate metastable states. The precursor gases used to deposit the desired material are chosen to provide the required depositing species to form the desired thin films on the substrates. One exemplary area of interest are amorphous semiconductors.

Additional objectives and aspects of the instant invention will be obvious from the detailed description, claims and drawings appended hereto.

DETAILED DESCRIPTION OF THE INVENTION

Figure 1:
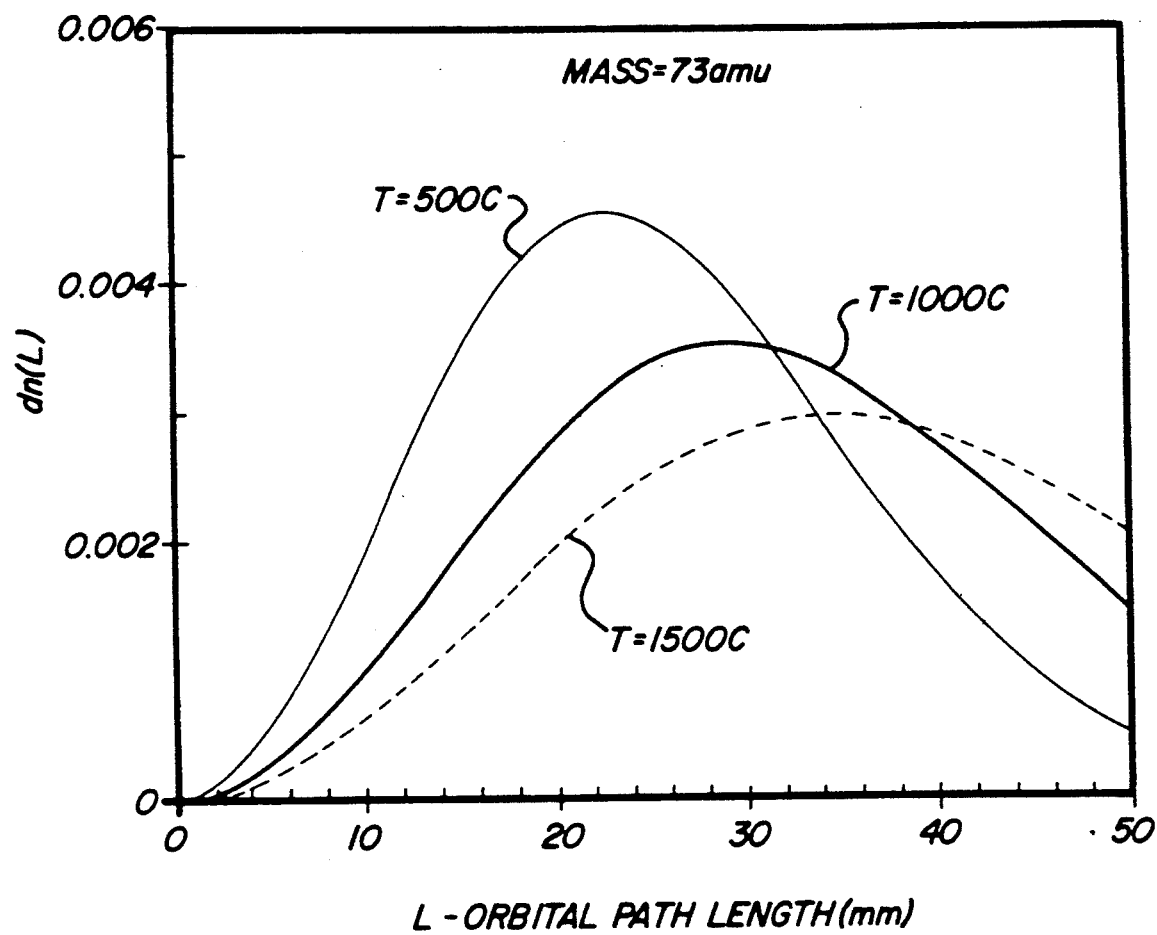
FIG. 1 is a graphical presentation illustrating the normalized distribution of number of germanium ions (mass=73 amu) that have an orbital length between L and L+0.1 mm in an external magnetic field of 875 Gauss, plotted on the ordinate versus the orbital path length L in mm plotted on the abscissa, the distributions are plotted for three temperatures 500°, 1000° and 1500° C.

To begin with, a brief discussion of the energy transfer mechanism in the plasma will be useful. The particles in a plasma usually have two types of energy: kinetic energy due to their motion and internal or potential energy which may be in various forms of electronic energy such as excitation, dissociation, and ionization energies. These energies are normally expressed in terms of eV or temperature (Note 1/40 eV equals ~300 K.). Energy can be transferred through either elastic or various forms of inelastic collisions. An elastic collision is one in which there is an interchange of kinetic energy only. An inelastic collision has no such restriction, and internal energies will also change. At high excitation frequencies (>1 MHz) only electrons can follow the applied AC field and gain energy, ions are essentially immobile. Therefore, in a conventional RF (13.56 MHz) or MW (2.45 GHz) plasma, energy transfer primarily involves neutral and ionic species colliding with electrons. However, the kinetic energy transfer from electrons to neutrals through elastic collisions is negligible due to the large difference in masses. Importantly, neutrals can gain internal energy from inelastic collisions as has been described previously. But, neutrals can only gain kinetic energy through elastic collisions with ions, preferably of similar mass, provided: (1) the degree of ionization is high so that there is a high probability of elastic ion-neutral collision; (2) the ions have the right amount of energy to transfer; and (3) the ions can regain their energy after each collision.

Our approach to energize the neutrals is to combine two resonance techniques in the PECVD system, i.e. the electron cyclotron resonance (ECR) and the ion cyclotron resonance (ICR). The microwave ECR (MWECR) technique has been developed over the years as a commercial technique for plasma ion etching and film deposition. The advantages of MWECR is that it is an electrodeless, low pressure process which produces a high degree of ionization. However, the kinetic temperatures of ions and neutrals remain low. Therefore, in addition to MWECR, a low frequency ion cyclotron resonance (LFICR) needs to be added to accelerate ions and thereby transfer energy to neutrals.

Electronic excitation of molecules at MW frequencies is notably more effective than at lower frequencies. This is because of the way in which MW radiation is resonantly absorbed. Note, in particular, the two resonant absorption mechanisms. The first mechanism involves elastic electron-neutral collisions; at sufficiently low energies (e.g., below molecular or atomic excitation levels), electrons will elastically collide with neutral gas species. If each collision coincides with an electric field reversal, the electron can continue to gain energy. Because of the low mass and high velocity of the electron, the collisional frequency tends to be in the GHz range. MW energy can be coupled to these collisions. The second mechanism involves plasma oscillations. The plasma oscillation is specifically related to properties of the plasma itself. In plasmas that are typically achieved in PECVD, the electron density is ~$10^{10}$ cm$^{-3}$. At these densities, the resulting plasma oscillation frequency is in the upper MHz to lower GHz range. MW radiation can also resonantly couple energy into these plasma oscillations. However, the MW energy coupling is very pressure dependent. Efficient energy coupling would occur in the pressure range of ~1-10 Torr depending on the gases used for the glow discharge plasma. With 2.45 GHz excitation frequency, the plasma density is usually limited by a critical density of $7.2 \times 10^{10}$ cm$^{-3}$. This results in a degree of ionization of <$10^{-5}$, which is too low for the purpose of our experiment. In order to achieve a high degree of ionization (~1-10%), a more efficient energy coupling mechanism in a lower pressure system is required. This is the reason to use MWECR. In ECR, microwave energy is coupled to the natural resonant frequency of the electrons in the presence of a static magnetic field. This resonant frequency occurs when the electron cyclotron frequency, which is defined as:

$$\omega = eB/m \qquad (1)$$

(where e=charge of an electron, B=strength of a static magnetic field and m=mass of the charged particle) equals the excitation frequency of 2.45 GHz. To create the ECR volume, a magnetic field strength of 875 gauss is required. The electrons are then accelerated from the MW energy in this ECR volume and in turn ionize and excite the neutrals much more efficiently than in a conventional MW system. Because of the ECR resonance, very efficient coupling can occur, even at pressure as low as 0.1 mTorr. For example, at 1 mTorr argon pressure the plasma densities can be as high as $5 \times 10^{12}$ cm$^{-3}$, and the degree of ionization increases to the 20%-25% range.

Although a high degree of ionization can be achieved in MWECR, the kinetic temperature of ions as well as neutrals remains low. In order for the neutrals to gain kinetic energy, the ions must gain the energy first. This is one reason to add LFICR to the MWECR microwave deposition process.

With the presence of a static magnetic field in the system, not only will electrons move in a cyclotron motion around the magnetic field with a electron cyclotron frequency, ions will also cirulate around the field with an ion cyclotron frequency. However, because of the heavier mass, the ion cyclotron frequency is much lower than electron cyclotron frequency. With the same magnetic field, i.e., 875 G for ECR, the ion cyclotron frequency of H, Si and Ge calculated from equation (1) are listed below:

| Atom | M(amu) | ICR frequency |
|------|--------|---------------|
| H    | 1      | 1.34 MHz      |
| Si   | 28     | 48.0 kHz      |
| Ge   | 73     | 18.5 kHz      |

With such low ion cyclotron frequencies, virtually no MW energy can be absorbed by the ions. Therefore, a low frequency (LF) modulation must be imposed to resonantly couple energy to the ions. The distinct and separate ICR frequency of these ion groups also offer the possibility of directly targeting a specific ion for resonant heating. For example, an 18.5 KHz modulation frequency will resonantly heat the Ge ion group such as $Ge^+$, $GeH^+$ etc. more effectively than the Si and H ion groups. It is important to realise that for the greatest increase in the kinetic energies of the active neutrals, the LF frequency should be chosen to cause ICR conditions in the ion group of the heaviest of the depositing species (i.e. largest energy transfers occur between masses of like size). That is, for example, in the deposition of Si-Ge alloys from silane and germane, the ICR frequency should be chosen to correspond to that required to resonate Ge group ions. However, if the heaviest depositing species in too small of an atomic percentage of the total, the next heaviest ion group should be chosen. This is because too low of a ratio of resonating ions to total neutrals will result in low energy transfer to the neutrals.

It should be noted that while the invention is herein described in terms of microwave energy at 2.45 GHz (which then fixes the magnetic field required for ECR and the frequency required for ICR), other commercial microwave frequencies exist (such as 915 MHz) which may be used in PECVD. This then would require a different magnetic field strength and different low frequency energy frequency to produce ECR and ICR.

Two principle methods by which the low frequency (LF) modulation can be imposed are capacitive couple and inductive coupling. With capacitive coupling, the electric field is applied using electrodes. However, in this type of coupling, the high electric potential of the electrode will impose its voltage on the plasma, i.e., a high plasma potential is developed. This potential depends somewhat on electrode geometry and usually is in the range of 50–100 volts. Note that in the microwave excitation of plasmas, the plasma potential will be much lower because there is no electrode. In the MWECR plasma system, because of the high degree of ionization, any high plasma potential developed from the added electrode should be avoided.

Other than the high plasma potential, the electric field from the capacitive technique cannot be effectively coupled to ions in the bulk of the plasma. Because plasmas are very good conductors, it is very difficult to directly expose an ion inside a plasma to an externally applied electric field. Debye shielding effectively screens the field. The only place in the discharge that electric fields exist is in the plasma sheath region. Unfortunately, for the plasma, ion acceleration in the sheath does not contribute to the thermal energy of ions in the plasma. This is because the ions accelerate away from the plasma toward the electrodes. In addition, those accelerated ions may cause sputtering and ion damage and do not significantly contribute to heating the neutrals because ion-neutral scattering is small in the sheath region (the mean free path is relatively long at low pressures ($\leq 10$ mTorr)). In other words, at low pressures, the plasma sheath is approximately collisionless. For these reasons, we conclude that low frequency modulation by capacitive coupling technique is not suitable.

Since the use of inductive coupling does not require the use of electrodes, the plasma potential will remain at the low levels of the unmodulated case. Inductive excitation is a commonly used technique to generate plasmas in plasma torches. Inductive excitation utilize a water cooled copper coil of a few turns. Since each turn can be considered a separate current loop, the induced time varying magnetic field vector has components both in the axial and radial directions, while the electric field vector is primarily in the tangential direction. This electric field then results in an electrical current ($J=\sigma E$) which circulates around the axial magnetic field. The penetration of this electric field into the plasma region, i.e., the skin depth, depends on the plasma density, the electron collision rate, and inversely on the applied frequency. In plasma torches operated at atmospheric pressure, the plasma density is in the $10^{18}$ $cm^{-3}$ range and the skin depth has been estimated to extend a few mm. However, in the case of a low temperature plasma with a plasma density of $10^{12}$ $cm^{-3}$ and frequencies in the range of 1–100 KHz, calculations show that the skin depths is in the range of $2\times 10^4$ to 20 cm. Dimensions of these magnitudes are greater than the plasmas of interest. This means that the induced electric fields from the inductive coupling technique can penetrate the entire bulk of the plasma and accelerate the bulk ions and heat the neutral species. Unlike capacitive coupling, the inductive currents (both electrons and ions) do not leave the plasma region, but continually circle within it. Inductive coupling therefore provides a much more effective coupling mechanism.

One of the important aspects to achieving resonance is the ability of the ions to complete at least one cyclotron orbit. If the charged species collides with another particle before completing the orbit, resonance coupling will be lost and the heating effectiveness will be reduced. This is why the ECR condition requires gas pressures lower than about 10 mTorr. The question is whether it is possible for ions to make one complete orbit before colliding with a neutral gas species, i.e., whether the orbital path length (L) is less than the mean free path ($\lambda$) for a collision to occur. Note, there exists an optimum $\lambda/l$ ratio (r) that results in the most effective heating of the gas. In terms of r, the ion will be able to orbit a certain number of times, acquiring the energy of $$\Sigma = er \int E \cdot dL \qquad (2)$$

before it collides, where the integral is over one orbit. So, for very large r ($r \gg 1$), the total energy gained will be very large. But in this case, most of the neutral species have bypassed the orbiting ion, thus limiting the effectiveness of transferring energy to the majority of neutral species. If, on the other hand, r is small (r<1), the ion-neutral transfer rate is high, but the energy per transfer is very low. Again, the total transfer of energy is low because the acquired energy of the ion is low. It is clear that an intermediate value of r exists that optimizes the transfer of ionic energy to the neutral species. This optimal r will depend on the magnitude of the electric field (E), i.e., on the power of the LF radiation. So for a fixed E, r can be controlled by varying the gas pressure, and will be different for ions of different mass. This is examined below.

It is important to note that the ratio of the species (electrons, ions and active electrically neutral species), relative to one another, in the plasma should be controlled. Particularly, the ratio of ions to active neutrals should be controlled. The reason for this control is to allow for the required increase in the surface mobility of the depositing species, while also preventing damage to the depositing thin film by excessive ion bombardment/deposition when the substrate is close to the ECR/ICR region of the plasma.

As is alluded to herein, one method of controlling the ratio of ions to active neutrals (also known as the ionization factor of the plasma) is by controlling the deposition pressure. Another means of increasing the probability of transferring kinetic energy from ions to neutrals, especially at lower ionization factors, is by increasing the total volume of the ECR/ICR zone and therefore, the probability of collision.

To compare the most probable orbital path length of a given ion at a given ion temperature with the mean free path, first determine the energy dependence of the ion cyclotron radius (R):

$$R = v M/(eB) = (2\epsilon/M)^{\frac{1}{2}} M/(eB) = (2\epsilon M)^{\frac{1}{2}}/(eB) \quad (3)$$

The orbital path length is then:

$$L = 2\pi(2\epsilon M)^{\frac{1}{2}}/(eB) = a(\epsilon M)^{\frac{1}{2}} \quad (4)$$

where a = 10.33 for a fixed field of 875 Gauss (which is required for ECR), $\epsilon$ is in eV, and M in amu. If it is assumed that the ions are initially thermalized, then the ions follow the Maxwell-Boltzmann energy distribution function $F(\epsilon)$. The probability of finding a particle in a range of energy $d\epsilon$, is $$dn(\epsilon) = F(\epsilon)d\epsilon = 2/\{\pi^{\frac{1}{2}}(k_BT)^{3/2}\}\epsilon^{\frac{1}{2}} \exp[-\epsilon/(k_BT)]d\epsilon \quad (5).$$

The energy probability function, Eq. (5), can be transformed using Eq. (4) to obtain the orbital probability function. The result is $$dn(L) = 4/\{\pi^{\frac{1}{2}}(a^2 M k_B T)^{3/2}\}L^2 \exp[-L^2/(a^2 M k_B T)]dL \quad (6).$$

FIG. 1 is a graphical presentation illustrating the normalized distribution of the number of germanium ions (mass=73 amu) that have an orbital length between L and L+0.1 mm in a magnetic field of 875 Gauss, plotted on the ordinate versus the orbital path length L in mm plotted on the abscissa. FIG. 1 shows the temperature behavior of the orbital path length for Ge at 500, 1000, and 1500 C. The average orbital path length is readily determined from Eq. (6) to be $$<L> = 2a(Mk_BT/\pi)^{\frac{1}{2}}.$$

Typical values of $<L>$ for the ions at various temperatures are summarized below for a B field of 875 Gauss.

| Temp. (C.) Ions | 25 $<L>$ (mm) | 500 $<L>$ (mm) | 1000 $<L>$ (mm) | 1500 $<L>$ (mm) |
|---|---|---|---|---|
| H | 1.87 | 3.01 | 3.86 | 4.56 |
| Si | 9.89 | 15.89 | 20.44 | 24.12 |
| Ge | 15.97 | 25.7 | 33.00 | 38.94 |

Rough estimates for the mean free path can be determined since the atomic diameters (d) are bounded roughly between 0.1 and 0.3 nm for atoms between atomic H and Ge. Since the mean free path is given by:

$$\lambda = k_B T/(P A 2^{\frac{1}{2}}) \quad (7).$$

where the area $A = \pi d^2$. Typical values are tabulated below at room temperature. Note that at higher temperatures, the $\lambda$ will increase.

Collisional mean free path at room temperature.

| d(nm) | A (nm$^2$) | P = 1 mTorr $\lambda$ (mm) | 10 mTorr $\lambda$ (mm) |
|---|---|---|---|
| 0.1 | 0.031 | 694 | 69.4 |
| 0.2 | 0.125 | 174 | 17.4 |
| 0.3 | 0.283 | 77 | 7.7 |

A comparison of the foregoing reveals that even for an ion as heavy as Ge, for pressures between 1 and 10 mTorr, the mean free path is longer than the ion cyclotron orbital path. Therefore, the resonance condition is met.

Previously, the possibility of targeting the LF energy to a specific ion group was mentioned. In the case of ICR however, it is the ion cyclotron frequency as described in Eq. (1) that is mass dependent. The preceding discussion is tied together by giving an example of how this mechanism works, in particular, the resonance is described. One of the important points to clarify is the response of the other ions. For Ge ions, the LF should be tuned to 18.5 KHz for a magnetic field of 875 Gauss. Remember that the magnetic field strength was determined by the need to establish an ECR condition. Because the phase of the driving force is constant relative to that of the orbiting Ge ion, the ion will continue gaining energy until scattered by a collision. At room temperature and at a pressure of 1 mTorr, the Ge ion will be able to make 4.8 (=77/16) revolutions, on average, before a collision occurs. Meanwhile, the H ions are also orbiting around the magnetic field at a rate of 1.34 MHz. Moveover, these ions will be able to make roughly 371 (=694/1.87) revolutions before any collisions will occur. Two points should be made: (1) first, since the applied frequency is not 1.34 MHz, each revolution will result in a negligible net gain of energy; and (2) second, the 18.5 KHz electric field will result in a drift in the entire orbit of the H ion, but this drift will also not gain energy.

This technique increases and controls the kinetic temperature of neutral species. It should be pointed out that the kinetic temperature of, for example, GeH$_3$ at 1000° C. will not cause gas phase decomposition and/or hydrogen evolution at the substrate. At the low operation pressure ($\leq 10$ mTorr), the bimolecular reaction rate is extremely low even at such elevated temperatures. This is because of the small bimolecular collision rate at these pressures. Furthermore, the kinetic temperature is not a thermal equilibrium temperature. At the surface, the reaction time is very short and will not cause hydrogen evolution.

Microwave excited PECVD has been attractive for a-Si:H deposition because of the high deposit rate. It is also because of the high rate deposition that the film quality is not as good as films deposited from a low-rate RF plasma system. With the dual resonance PECVD system proposed herein, the surface mobility of the precursor species can be enhanced without concerns over hydrogen evolution.

In a plasma with a high degree of ionization, the acceleration of ions toward the substrate generated from any DC field should be avoided. Since there is no electrode in the system, the plasma potential is much lower than in a comparable capacitively coupled PECVD system. Furthermore, the ions will be confined around the magnetic field lines which run parallel to the plane of the substrate. Therefore, ion damage on the film is minimized.

It should be noted that typically, the substrate upon which the thin film is being deposited is outside the ECR/ICR magnetic region and is therefore not highly bombarded by ions, and therefore, the ion damage can be avoided in this manner. Also, the distance between the ECR/ICR region and the substrate can be adjusted to vary the types and ratios of depositing species. For example, in a Si-Ge alloy deposition, if the substrate is closer to the ECR/ICR region, then the ratios of GeH/GeH$_3$ and SiH/SiH$_3$ would be higher than if the substrate were further removed. This is because GeH and SiH are shorter lived more highly reactive species than are GeH$_3$ and SiH$_3$. Therefore, in this manner, the thin film composition may be controlled.

In a microwave deposition apparatus useful for performing the method of the instant invention, a modified Linear Applicator is placed inside the vacuum environment and a modified single point microwave vacuum feed-through is used to supply microwave energy to the applicator. In this way, the only vacuum window is the relatively small one in the microwave feed-through itself.

Figure 2:
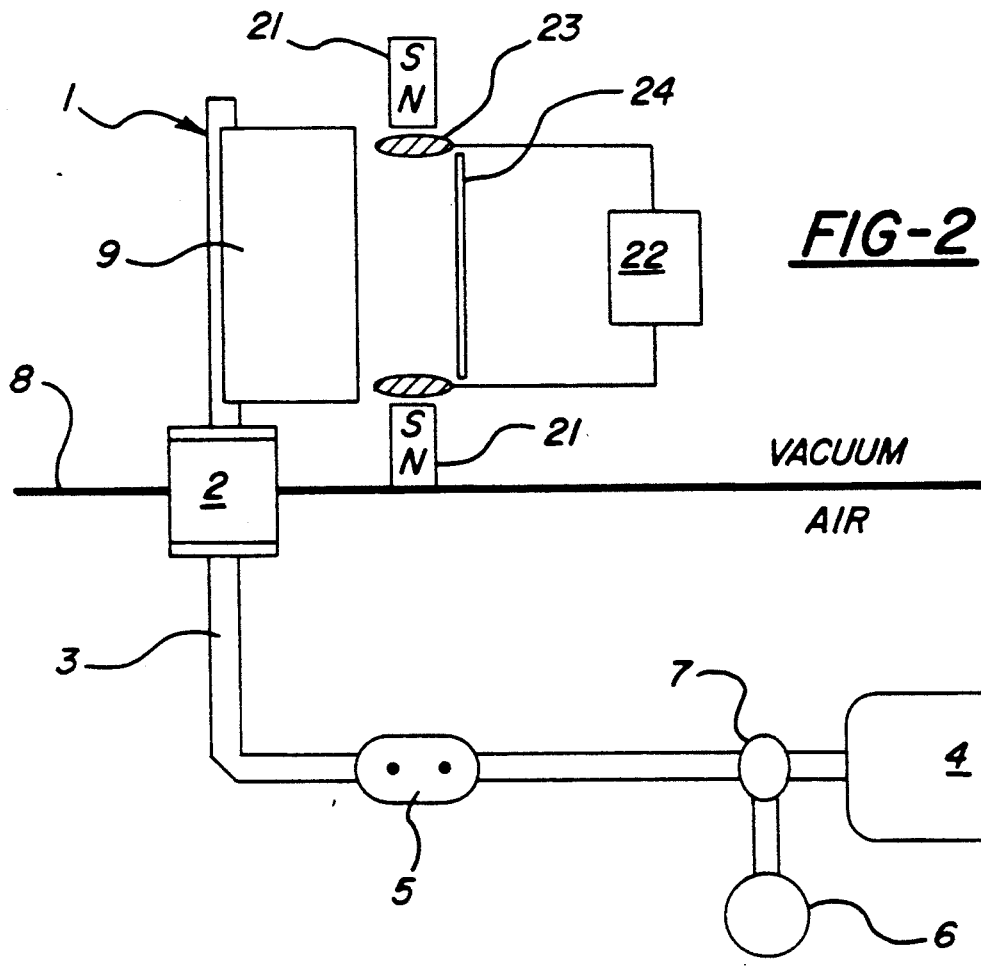
FIG. 2 is a partial schematic diagram, not to scale, of a microwave deposition apparatus useful for performing the method of the present invention, specifically depicting an improved vacuum feed-through and an improved linear applicator.

FIG. 2 is a schematic depiction of a microwave deposition system including the improved microwave vacuum feed-through 2 and improved linear applicator 1 useful in performing the method of the present invention. Microwaves (typically at a frequency of 2.54 GHz and a power of about 2-5 kWatts), are created in microwave generator 4. These microwaves travel along the microwave wave guide 3, passing through circulator 7. The circulator 7 prevents any reflected microwave energy from entering the microwave generator by passing the reflected energy to the dummy load 6. The microwave energy created in the generator 4 also passes through a microwave power meter 5, which measures the forward and reflected microwave power. Next the microwave energy passes through the improved microwave vacuum feed-through 2 which provides the vacuum-to-air seal at the deposition chamber wall 8. Finally the microwave energy passes into the improved linear applicator 1 of the present invention. As the microwave energy exits the applicator 1, some of the energy is reflected back into the applicator 1 by reflectors 9 and is reradiated at other points along the applicator.

Microwave energy which exits the applicator 1, interacts with the static magnetic filed which is created by magnets 21 (permanent magnets and/or electromagnets) creating an electron cyclotron resonance condition within the plasma which is contained between the applicator 1 and the substrate 24. The additional non-microwave electronic energy is provided to the plasma via low frequency antennae (also called electrodes herein) 23. Typically these antennae 23 are large diameter copper coils of about 3-5 loops. These antennae 23 are electrically attached to a low frequency alternating electrical field generator 22. The low frequency alternating electromagnetic energy emanating form the antennae 23, in conjunction with the magnetic field created by the magnets 21, causes an ion cyclotron resonance condition within the plasma.

Figure 3:
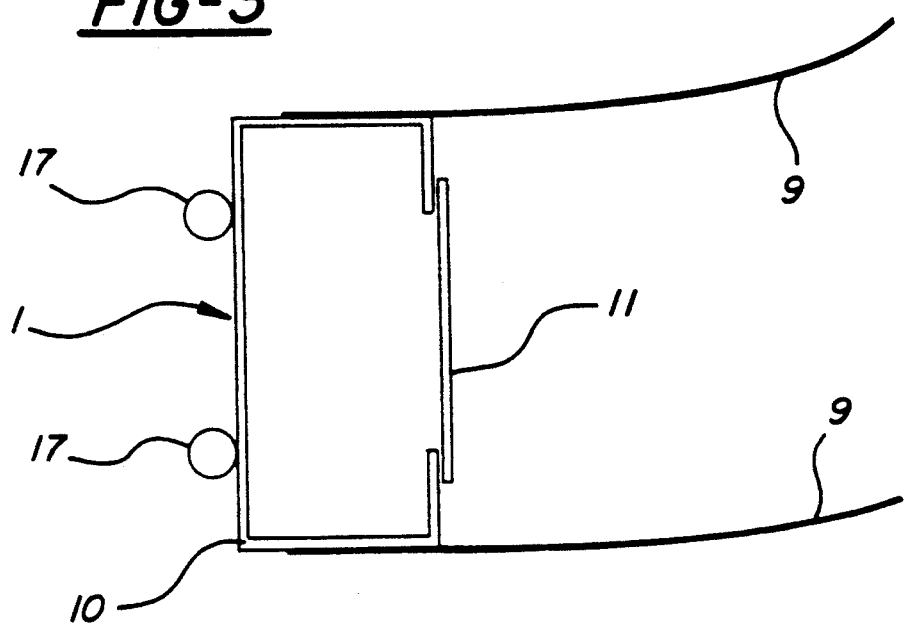
FIG. 3 is a top view, not to scale, of an improved linear microwave applicator useful in an apparatus for performing the method of the present invention, specifically illustrating microwave reflecting panels.
Figure 4:
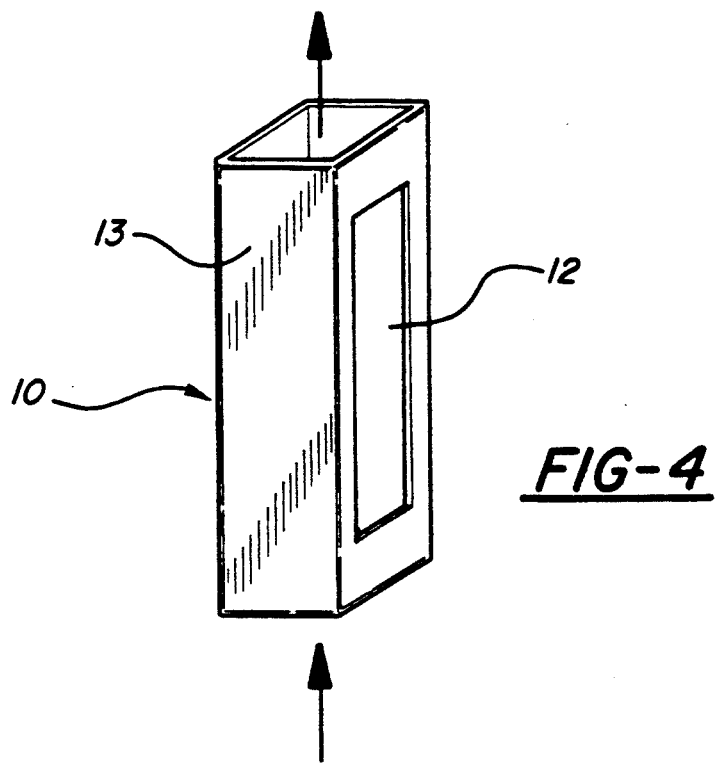
FIG. 4 is a partial side view, not to scale, of the microwave wave guide portion of the linear microwave applicator useful in performing the method of the present invention, specifically illustrating the rectangular wave guide portion of the applicator and the microwave radiative slot formed in one of the wider faces thereof.

Turning now to FIGS. 3 and 4, there is depicted therein a top and side view of an improved linear applicator useful in an apparatus for performing the method of the instant invention, respectively. FIG. 3 specifically illustrates the reflector panels 9 and the curvature thereof. Also illustrated in FIG. 3 is the rectangular applicator wave guide body 10. The applicator is cooled, as needed, by passing cooling fluid through channels 17 which are attached to the applicator body 10 on the wider face thereof which is opposite that which includes the radiative slot (reference numeral 12 of FIG. 4). Covering the radiative slot 12 is a loose fitting quartz plate 11.

Normally, one would expect that since the applicator body wave guide 10 is inside the vacuum environment, plasma would be produced on the inside of the wave guide as microwave energy travels therein. However, it has been found that this is not necessarily so. The formation of the plasma has been found to depend on the pressure within the waveguide. If the pressure is sufficiently low (i.e., less than about 1 mTorr) magnetic confinement then becomes necessary to sustain a plasma. In the operation of the system of the present invention, the average pressure within the applicator body is about 1 mTorr. The microwaves travel up the wave guide body 10 of the linear applicator and radiate out the radiative slot 12 on one side of the guide into a region of slightly higher pressure nearer the gas feed manifold (not shown). A loose fitting quartz plate 11 separates the inside of the guide body 10 from the region of elevated pressure. This plate 11 is neither a structural element, nor a major vacuum component.

Returning now to FIGS. 3 and 4, the wave guide 10 is a standard 1.5×3.0 in. guide. A slot 12 is cut along the length of the guide in the z-direction (large dark arrows in FIG. 4) on one of the wider faces thereof (i.e., the 3 in. side). It should be noted that the width of the slot is uniform along the entire length thereof. With respect to FIG. 4, the microwaves enter the bottom of the Applicator wave guide 10 from the feed-through (reference numeral 2 of FIG. 2), and radiate out the slot 12. Excess microwave energy not radiated out the slot is (normally) transmitted to the top of the guide (where it also radiates). If the slot is wide enough, and/or the length of the slot is long enough, no energy remains at the top of the guide. It should also be noted that, without the reflector fins 9 and, because the slot 12 is of uniform width, the energy radiated out of the slot 12 decays exponentially from bottom to top thereof.

The exponentially decaying property occurs when there is only radiating energy, i.e., only outward going microwave energy. The installation of the reflecting panels 9 plays an important role in creating uniformity of the radiating microwave energy, because they introduce another term to the radiation picture. That is, a reflected, inward traveling component of microwave energy. These panels 9, are attached on each of the narrower sides 13 of the applicator body 10 and curvedly extend past the face containing the long slot 12 toward the plasma zone. The curved panels 9, are formed of a microwave reflecting material such as stainless steal or aluminum and reflect a portion of the outgoing microwave energy back into the applicator wave guide body 10. In the present configuration, the width of the slot 12 is such that after 15 inches of slot, about 50% of the energy is transmitted to the top of the guide. However, the wave nature of microwaves is shown dramatically when one of the panels 9 is slowly brought into place. It has been found that the energy transmitted out the top of the waveguide body 10 drops down to only 30% and that as the other panel 9 is then brought into place, the energy transmitted out the top drops to near 0%, with only about 5% reflected back out the bottom of the applicator body 10. In other words, the installation of the reflecting panels 9 has actually increased the amount of microwave energy which is radiated out of the radiative slot 12). Curvature of the panels 9 is important to achieve the desired level of tuning, but the panels 9 are not required to be touching the sides 13 of the wave guide body 10. It has been found that the same results are obtained even when there is a small gap between the guide body 10 and the reflecting panels 9. Also, the loose quartz plate 11 shown in FIG. 3 does not qualitatively change the microwave radiation uniformity.

It is clear from the above discussion that uniformity is an inherent aspect of the linear applicator of the present invention. If one location along the slot 12 radiates more strongly than neighboring positions, there is then correspondingly more radiation to be reflected and fed back into the wave guide body 10. This energy can then be redistributed to other locations along the applicator 1. Uniformity of deposition has been measured to +/−5% over a distance of 12 inches.

Figure 5:
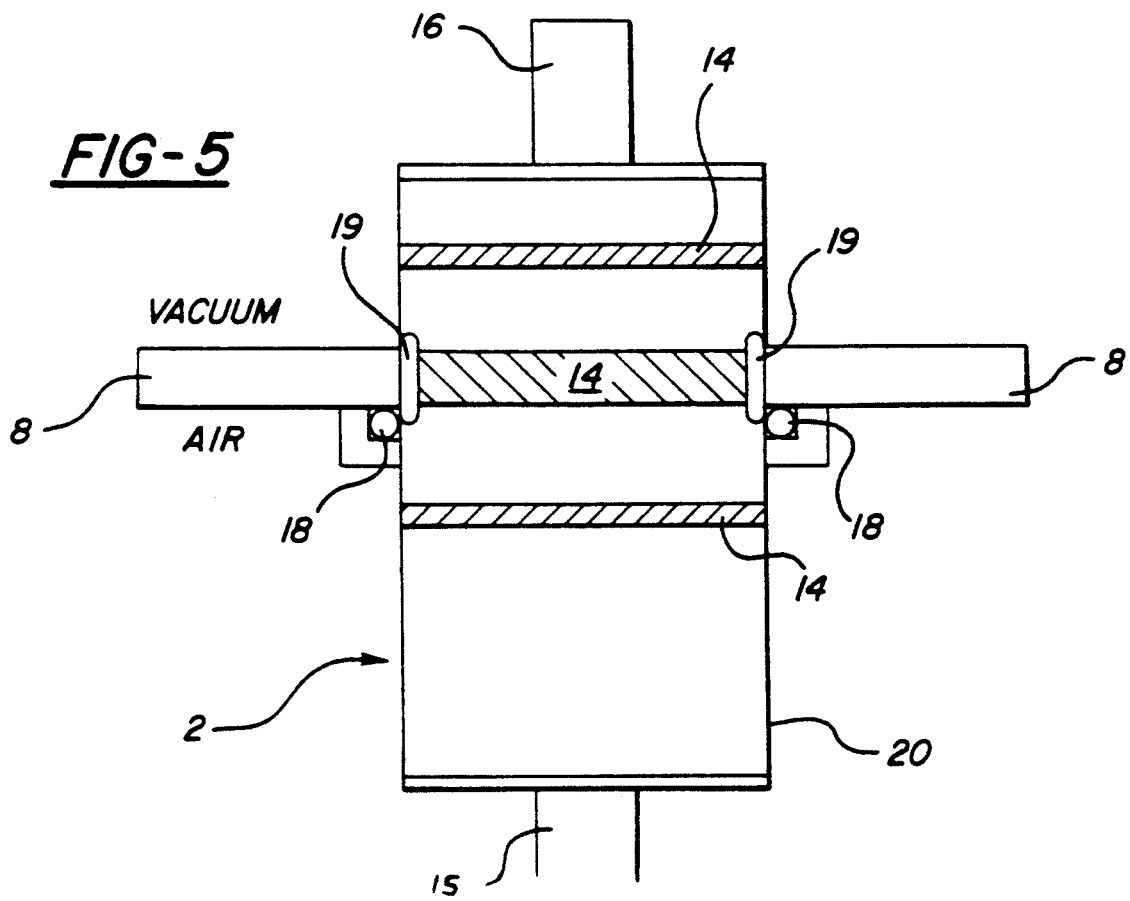
FIG. 5 is a cross sectional side view, not to scale, of a microwave vacuum feed-through useful in an apparatus for performing the method of the instant invention, specifically illustrating the microwave transmissive plates and the vacuum seals for isolating the interior vacuum from the exterior atmosphere.

Turning now to FIG. 5, there is depicted therein a cross sectional side view of the improved microwave vacuum feed-through of the present invention. The prior art microwave feed-through was designed to withstand the high temperature problems of direct exposure to the plasma, and its transmission property was not then of concern. Direct use of the prior-art feed-through in the system of FIG. 2 showed that a large impedance mismatch existed between the feed-through 2, the wave guide 3 and the linear applicator 1. High power measurements showed that for 5 kW incident from the MW generator, 2 kW were reflected by the feed-through so that 3 kWatts (at the most) were being delivered into applicator. Low power bench top measurements confirmed that 40% of the incident power was reflected. Those same measurements showed that only about 35% of the incident power was successfully coupled into the applicator wave guide 10. The remaining 25% was lost to radiation and/or to resistive losses at the connection between the applicator 1 and the feed-through 2.

Therefore, the microwave vacuum feed-through of the instant invention has been constructed to use constructive and destructive interference (i.e. the wave nature of microwaves) to eliminate the reflected portion of the microwave energy by impedance matching the feed-through 2, to the wave guide 3 and the applicator 1. The microwave feed-through 2 includes a feed-through body 20 which is essentially a hollow cylindrical chamber, although, if needed, a cooling jacket can be used to eliminate any possible heating problems. Within the body 20, is three or more dielectric plates 14. In a preferred embodiment, the dielectric plates consist of three 4 in. OD alumina disks which are each separated by a particular distance. Each of the spacings between the disks is different from the others and the optimum spacing is determined empirically to tune the impedance of the feed-through 2. The middle disk is preferably twice as thick as the other two disks and serves as the point to which the vacuum seal is made by a Teflon o-ring 19. Therefore, the spaces between the middle disk 14 and the linear applicator connection means 16 are under vacuum while the spaces between the middle disk 14 and the wave guide connection means 15 are filled with air. It should be noted here that all the materials which are placed within the feed-through body 20 must be microwave compatible.

The connection means 15 and 16 are formed such that a microwave tight seal is formed between said means and the wave guide 3 and the applicator 1 respectively. The feed-through also includes Viton o-ring sealing means 18 to provide a vacuum seal, at the chamber wall 8, between the interior vacuum region and the exterior air region.

Low power bench top measurements showed that the feed-through 2 of the present invention coupled up to 95% of the incident energy from the outer wave guide 3 to the applicator wave guide 10, with no detectable reflection. High power measurements (<3 kW) into a dummy load (i.e., no plasma conditions) confirmed the low power results. The unaccounted 5% is most likely due to resistive losses on the inside of the feed-through. With the nearly perfect transmission, a "transparent connection" has been achieved between the wave guide transmission line 3 and the applicator wave guide 10.

As was stated hereinabove, there are two ways to resonantly couple energy into a plasma: (a) by high frequency radiation, which couples into the electrons; and (b) by low frequency radiation, which couples into the ions. When energy is pumped into the ions, their energy is very effectively transferred into the neutrals owing to their similarity in masses. Heating of the neutrals is desirable because it is the neutrals which overwhelmingly account for the deposition rate. It should be noted that because a relatively few ions must heat a large number of neutrals, efficiency requirements dictate the need to resonantly couple energy into the ions.

Modifications and variations of the present invention are possible in light of the above teachings. It is therefore to be understood that within the scope of the appended claims the invention may be practice otherwise than as specifically described.

We claim:

1. An improved method for the high-rate, low-temperature deposition of thin films, said method including the steps of:

providing an evacuated chamber having a plasma deposition region defined therein;

placing a substrate within said deposition region;

supplying plasma deposition precursor gases to said deposition region in said evacuated chamber;

directing microwave energy, from a source thereof, to said deposition region, said microwave energy interacting with said deposition precursor gases to form a plasma of electrons, ions and activated electrically neutral species, said plasma including one or more depositing species;

increasing the surface mobility of said depositing species in said plasma by coupling a low frequency alternating electrical field and magnetic energy into said plasma, without intentionally adding thermal energy to the substrate or precursor gas; and depositing a thin film of material onto said substrate.

2. The method of claim 1, including the further step of controlling the ratio of species relative to one another within said plasma so as to thereby provide the increase in surface mobility of the depositing species without causing degradation of the depositing thin film.

3. The method of claim 2, wherein the step of controlling the ratio of species includes controlling the ratio of ions to activated electrically neutral species.

4. The method of claim 1, wherein said magnetic energy is a magnetic field which is coupled to the microwave energy so as to provide electron cyclotron resonance.

5. The method of claim 4, wherein said magnetic field is 875 gauss within the plasma and is coupled to the microwaves which have a frequency of 2.45 GHz.

6. The method of claim 4, wherein said low frequency alternating electrical field has a frequency of less than about 1 MHz.

7. The method of claim 6, wherein the frequency of said low frequency alternating electrical field creates an ion cyclotron resonance condition for one or more groups of ions in said plasma, under the influence of said magnetic field.

8. The method of claim 7, wherein said precursor gases includes one or more of $GeH_4$, $GeF_4$, $SiH_4$, $SiF_4$, $F_2$, and $H_2$, and also may include inert, non-depositing gases such as argon or helium.

9. The method of claim 8, wherein the frequency of said low frequency alternating electrical field is about 18.5 kHz and ion cyclotron resonance is created for the Ge group of ions.

10. The method of claim 8, wherein the frequency of said low frequency alternating electrical field is about 48 kHz and ion cyclotron resonance is created for the Si group of ions.

11. The method of claim 8, wherein said microwaves energy is supplied at a power of between about 2 and about 5 kiloWatts and the low frequency alternating electrical field is supplied at a power of between 0.1 and 1.0 kiloWatts.

12. The method of claim 1, wherein said magnetic energy is supplied by permanent magnets placed in close proximity to said deposition region.

13. The method of claim 1, wherein said magnetic energy is supplied by electromagnets placed in close proximity to said deposition region.

14. The method of claim 1, wherein said non-microwave electrical energy is supplied by antennae electrodes placed in close proximity to said deposition region.

15. The process of claim 1, wherein said precursor gases provide the required depositing species to form semiconductor thin films on said substrates.

16. The method of claim 15, wherein semiconductor thin film is an amorphous semiconductor.

17. The process of claim 1, wherein said precursor gases provide the required depositing species to deposit a thin film including one or more materials selected from the group consisting of metals, ceramics, polymers, glasses, semiconductors, photoactive materials, dielectrics, insulators, oxides, nitrides and mixtures or alloys thereof onto the substrate.

18. The process of claim 17, wherein the total microstructural local environment of the deposited thin film includes one or more of amorphous, nanocrystalline, microcrystalline, polycrystalline and monocrystalline as well as combinations thereof and intermediate metastable states.

* * * * *